(12) United States Patent
Tsukagoshi

(10) Patent No.: US 7,916,369 B2
(45) Date of Patent: Mar. 29, 2011

(54) HOLOGRAPHIC RECORDING AND REPRODUCING APPARATUS

(75) Inventor: Takuya Tsukagoshi, Tokyo (JP)

(73) Assignee: TDK Corporation, Tokyo (JP)

( * ) Notice: Subject to any disclaimer, the term of this patent is extended or adjusted under 35 U.S.C. 154(b) by 807 days.

(21) Appl. No.: 10/796,394

(22) Filed: Mar. 9, 2004

(65) Prior Publication Data

US 2004/0179252 A1  Sep. 16, 2004

(30) Foreign Application Priority Data

Mar. 14, 2003  (JP) .................... 2003-070664

(51) Int. Cl.
*G03H 1/16* (2006.01)
(52) U.S. Cl. .............. 359/29; 359/30; 359/35
(58) Field of Classification Search ......... 359/29
See application file for complete search history.

(56) References Cited

U.S. PATENT DOCUMENTS

| | | | |
|---|---|---|---|
| 6,040,930 A | 3/2000 | Heanue et al. | 359/21 |
| 6,163,391 A * | 12/2000 | Curtis et al. | 359/29 |
| 6,301,028 B1 * | 10/2001 | Tanaka et al. | 359/22 |
| 6,317,404 B1 * | 11/2001 | Kawano et al. | 369/103 |
| 7,535,608 B2 * | 5/2009 | Kawano et al. | 359/29 |
| 7,535,609 B2 * | 5/2009 | Yasuda et al. | 359/29 |
| 2005/0134948 A1 * | 6/2005 | Waldman et al. | 359/3 |
| 2008/0259421 A1 * | 10/2008 | Curtis et al. | 359/21 |
| 2010/0014138 A1 * | 1/2010 | Butler et al. | 359/22 |

FOREIGN PATENT DOCUMENTS

| | | |
|---|---|---|
| JP | 07-020765 A | 1/1995 |
| JP | 07-141587 A | 6/1995 |
| JP | 08-314361 | 11/1996 |
| JP | 11-052115 A | 2/1999 |
| JP | 2000-155297 | 6/2000 |
| JP | 2002-123161 | 4/2002 |

OTHER PUBLICATIONS

Bernal, M., et al., "Noise in High-Areal-Density Holographic Data Storage Systems," *Opt. Soc. America*, Washington, DC, USA, May 1998, pp. 21-22.
Chou, W-C., et al., "Interleaving and Error Correction in Volume Holographic Memory Systems," *Applied Optics* 37(29):6951-6968, Oct. 10, 1998.
Japanese Office Action, mailing No. 125332, mailing date Mar. 24, 2009, 3 pages.

* cited by examiner

*Primary Examiner* — Arnel C Lavarias
(74) *Attorney, Agent, or Firm* — Seed IP Law Group PLLC

(57) ABSTRACT

A holographic recording and reproducing apparatus includes a spatial light modulator, a Fourier transform lens, a reverse Fourier transform lens, a Charge Coupled Device (CCD) image sensor, and a pinhole disposed at a confocal point of the Fourier transform lens and the reverse Fourier transform lens, the holographic recording medium being disposed between the Fourier transform lens and the reverse Fourier transform lens, and the focal length of the Fourier transform lens and focal length of the reverse Fourier transform lens being different from each other, and the pinhole being disposed between the holographic recording medium and the Fourier transform lens or between the holographic recording medium and the reverse Fourier transform lens.

3 Claims, 4 Drawing Sheets

HOLOGRAPHIC RECORDING AND REPRODUCING APPARATUS

BACKGROUND OF THE INVENTION

The present invention relates to a holographic recording and reproducing apparatus, and more particularly, to a holographic recording and reproducing apparatus which can be made compact even in the case where electronic devices such as a spatial light modulator, a CCD image sensor and the like having a large size and low resolution are used.

DESCRIPTION OF THE PRIOR ART

The holographic method of recording and reproducing information is known as one method for realizing high-density information recording on a recording medium. In an ordinary holographic recording and reproducing method, information is recorded by overlapping a signal beam and a reference beam on the holographic recording medium to write the interference fringes formed thereby. The information recorded in the recording medium can be reproduced by irradiating the recording medium with the reference beam. The reference beam projected onto the recording medium is diffracted by the diffraction grating formed by the interference fringes, thereby causing two-dimensional information to appear as reproduced information. In such a recording medium, since all of the image information carried by the signal beam is reproduced at one time, high speed reproduction can be realized.

In a holographic recording and reproducing apparatus, a laser beam emitted from a laser beam source is normally expanded by a beam splitter (See Japanese Patent Application Laid Open No. 2002-123161). The entire image surface of a spatial light modulator can be effectively utilized by using this technique when a signal beam is modulated using the spatial light modulator. Further, in order to reduce noise, it is known to dispose a spatial filter immediately before a holographic recording medium on the optical path of a signal beam or a reference beam, or a beam expander including a spatial filter (See Japanese Patent Application Laid Open No. 08-314361).

Furthermore, a spatial light modulator including beam diameter transforming optical systems each including a light modulating section divided into a plurality of pixels and at least two micro-lens arrays and adapted for projecting a light beam having a smaller beam diameter than that of a light beam incident thereon onto each of the pixels of the light modulating section (See Japanese Patent Application Laid Open No. 2000-155297). According to the thus constituted spatial light modulator, since each of the pixels of the light modulating section can be focused so as to accurately correspond to one of the pixels of a CCD image sensor, a large amount of information can be processed and the transmission speed of information can be increased without increasing the number of pixels of the CCD image sensor.

Since the resolution of an electronic device such as a spatial light modulator, a CCD image sensor or the like is generally lower than that of a holographic recording medium (a light sensitive material), the resolution of a holographic recording medium is restricted by the resolution of an electronic device.

Further, in a conventional optical system, since a beam diameter is determined in conformity with a spatial light modulator or a CCD image sensor having a larger size and lower resolution, the beam diameter inevitably becomes large. In the case where a beam diameter is determined larger, since it is necessary to make optical elements such as a beam splitter, lens or the like larger and the optical path length inevitably becomes longer, the optical system, namely, the holographic recording and reproducing apparatus becomes larger.

SUMMARY OF THE INVENTION

It is therefore an object of the present invention to provide a holographic recording and reproducing apparatus which can be made compact even in the case where electronic devices such as a spatial light modulator, a CCD image sensor and the like having a large size and low resolution are used.

The above and other objects of the present invention can be accomplished by a holographic recording and reproducing apparatus for recording data as phase information of light in a holographic recording medium by projecting a signal beam and a reference beam thereonto, the holographic recording and reproducing apparatus comprising at least a spatial light modulator, a Fourier transform lens, a reverse Fourier transform lens and a CCD image sensor, the holographic recording medium being disposed between the Fourier transform lens and the reverse Fourier transform lens, and the focal length of the Fourier transform lens and focal length of the reverse Fourier transform lens being different from each other.

According to the present invention, it is possible to provide a holographic recording and reproducing apparatus that can be made compact even in the case where electronic devices such as a spatial light modulator, a CCD image sensor and the like having a large size and low resolution are used.

In a preferred aspect of the present invention, the focal length of the Fourier transform lens is set to be longer than that of the reverse Fourier transform lens.

According to this preferred aspect of the present invention, since the focal length of the Fourier transform lens is set to be longer than that of the reverse Fourier transform lens, the optical path length can be shortened and a CCD image sensor having a smaller size and higher resolution than those of the spatial light modulator can be employed, whereby the size of the holographic recording and reproducing apparatus can be reduced.

In another preferred aspect of the present invention, the focal length of the reverse Fourier transform lens is set to be longer than that of the Fourier transform lens.

According to this preferred aspect of the present invention, since the focal length of the reverse Fourier transform lens is set to be longer than that of the Fourier transform lens, the optical path length can be shortened and a spatial light modulator having a smaller size and higher resolution than those of the CCD image sensor can be employed, whereby the size of the holographic recording and reproducing apparatus can be reduced.

In a further preferred aspect of the present invention, the holographic recording and reproducing apparatus further comprises a pinhole disposed at a confocal point of the Fourier transform lens and the reverse Fourier transform lens.

According to this preferred aspect of the present invention, the function of a spatial filter can be added to the holographic recording and reproducing apparatus by disposing the pinhole at the confocal point of the Fourier transform lens and the reverse Fourier transform lens and it is therefore possible to remove a noise component when data are recorded or data are reproduced.

The above and other objects and features of the present invention will become apparent from the following description made with reference to the accompanying drawings.

DESCRIPTION OF THE PREFERRED EMBODIMENTS

Figure 1:
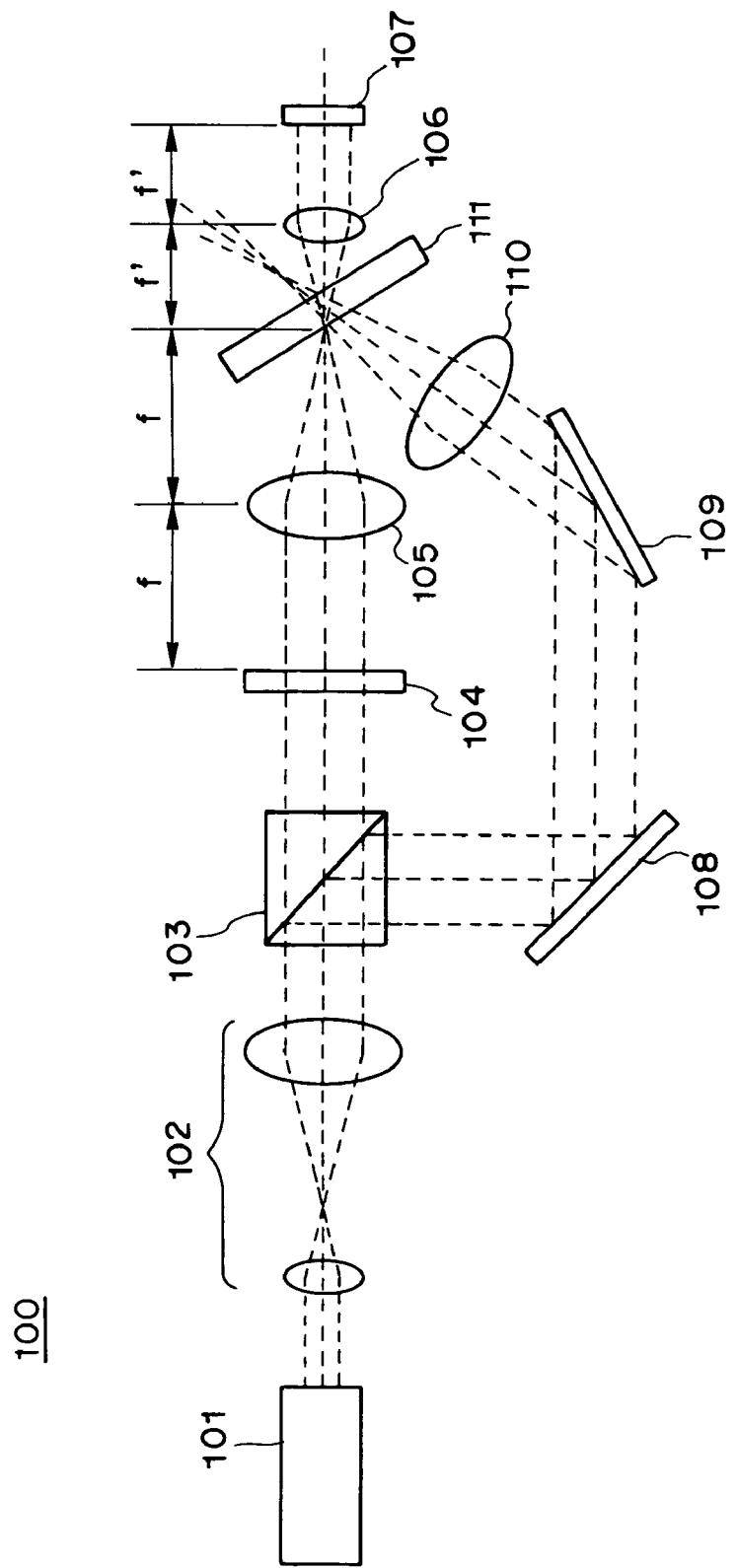
FIG. 1 is a block diagram of a holographic recording and reproducing apparatus that is a preferred embodiment of the present invention.

FIG. 1 is a block diagram of a holographic recording and reproducing apparatus that is a preferred embodiment of the present invention.

As shown in FIG. 1, a holographic recording and reproducing apparatus 100 according to this embodiment includes a laser beam source 101 for emitting a laser beam for recording data or reproducing data, a beam expander 102 for expanding a laser beam emitted from the laser beam source 101, a beam splitter 103 for splitting the expanded laser beam, a spatial light modulator (SLM) 104 disposed on an optical path of one of laser beams generated by splitting the laser beam by the beam splitter 103, a Fourier transform lens 105, a reverse Fourier transform lens 106 and a CCD image sensor 107.

A holographic recording medium 111 is disposed between the Fourier transform lens 105 and the reverse Fourier transform lens 106.

The holographic recording and reproducing apparatus 100 further includes a first mirror 108 and a second mirror 109 for altering the optical path of the other laser beam generated by splitting the laser beam by the beam splitter 103 to lead it to the holographic recording medium 111, and a Fourier transform lens 110. Although described later in detail, the two laser beams are projected onto the same position in the holographic recording medium 111.

The laser beam source 101 is adapted to generate a signal beam and a reference beam and is constituted by a combination of a YAG laser beam source and a Second Harmonic Generation (SHG) laser beam, for example.

A laser beam emitted from the laser beam source 101 passes through the beam expander 102, whereby the beam is expanded in diameter and made a parallel beam, whereafter the laser beam is split by the beam splitter 103 into a signal beam and a reference beam. The signal beam enters the spatial light modulator 104.

The spatial light modulator 104 has a large number of pixels arranged in a matrix and spatially modulates the intensity of the light beam by selectively passing or blocking the light beam at each pixel, thereby generating a signal beam carrying information. A liquid crystal device, for example, is employed as the spatial light modulator 104. Otherwise a DMD (digital micro-mirror device) can be used. Since the size of each of the pixels of the spatial light modulator 104 is about 3 μm and relatively large, the area of the entire image surface thereof is inevitably large. However, the entire image surface of the spatial light modulator 104 can be effectively utilized by expanding the beam diameter of the laser beam by the beam expander 102.

During recording, the data to be recorded are converted into two-dimensional dot matrix components by an encoder (not shown) and input into the spatial light modulator 104. The intensity of the signal beam is spatially modulated by selectively passing or blocking the signal beam at each pixel.

The signal beam passing through the spatial light modulator 104 impinges on the holographic recording medium 111 via the Fourier transform lens 105.

The Fourier transform lens 105 effects Fourier transformation on the dot matrix components of the signal beam and condenses the signal beam so that it is focused onto a portion slightly before or behind a recording position in the holographic recording medium 111, thereby projecting the signal beam onto the holographic recording medium 111.

On the other hand, the reference beam passes through the first mirror 108 and the second mirror 109, whereby the advancing direction thereof is altered. The reference beam further passes through the Fourier transform lens 110 and impinges on the holographic recording medium 111.

The reference beam and the signal beam are projected onto the same position in the holographic recording medium 111, so that the signal beam and the reference beam overlap. Thus, an interference pattern is formed by interference of the signal beam and the reference beam, whereby data are recorded in the holographic recording medium 111 as phase information of light.

When data are to be reproduced, all of the pixels of the spatial light modulator 104 are turned off, thereby blocking the signal beam.

Therefore, the holographic recording medium 111 is irradiated with only the reference beam. The intensity of the reference beam projected onto the recording position in the holographic recording medium 111 is modulated by the interference pattern and a beam carrying information is reproduced that is similar to the signal beam.

The thus reproduced beam, which has been diffracted by the interference pattern in the direction of the optical axis of the signal beam, enters the reverse Fourier transform lens 106. Reverse Fourier transformation is effected on the reproduced beam by the reverse Fourier transform lens 106, whereby the reproduced beam is transformed into a beam including dot matrix components and made parallel. The beam then enters the CCD image sensor 107, which converts the intensity of the beam into electrical digital signals at each pixel thereof. The signals are decoded to the original data by a decoder (not shown).

In this embodiment, the focal length f of the Fourier transform lens 105 is set to be longer than the focal length f' of the reverse Fourier transform lens 106. Therefore, even if the beam diameter of the signal beam is expanded in front of the spatial light modulator 104, the beam diameter of the signal beam passing through the Fourier transform lens 105 and the reverse Fourier transform lens 106 becomes smaller than that of the signal beam which has not yet passed through the Fourier transform lens 105.

When data are to be reproduced, only the reference beam is projected onto the holographic recording medium 111 and the reference beam is diffracted by the interference pattern in the direction of the optical axis of the signal beam, thereby generating a reproduced beam. At this time, a reproduced beam is emitted that has a small beam diameter like the signal beam passing through the holographic recording medium 111.

Therefore, a CCD image sensor 107 having a small size and high resolution can be employed irrespective of the resolution of the spatial light modulator 104.

Further, in this embodiment, the focal length f' of the reverse Fourier transform lens 106 and the equally set distance between the reverse Fourier transform lens 106 and the CCD image sensor 107 are determined to be shorter than the focal length f of the Fourier transform lens 105 and the equally set distance between the Fourier transform lens 105 and the spatial light modulator 104. Since this shortens the optical length between the point on which the signal beam is focused and the CCD image sensor 107, the holographic recording and reproducing apparatus 100 can be made small.

Figure 2:
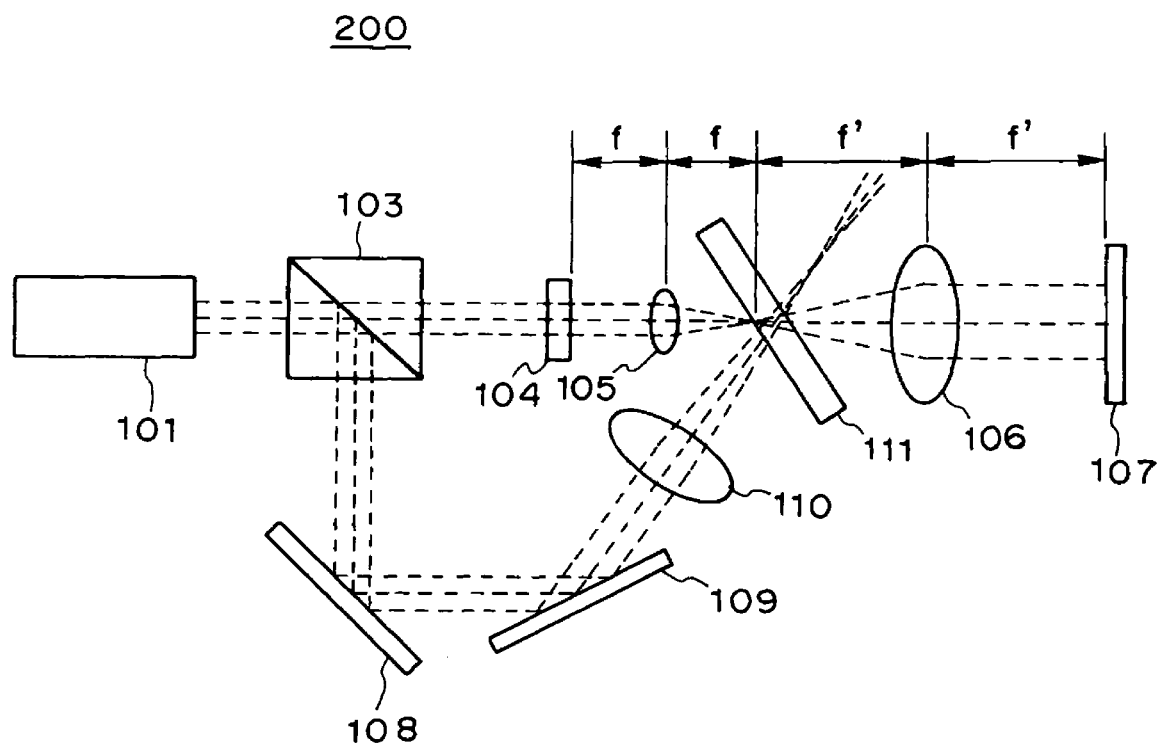
FIG. 2 is a block diagram of a holographic recording and reproducing apparatus that is another preferred embodiment of the present invention.

FIG. 2 is a block diagram of a holographic recording and reproducing apparatus that is another preferred embodiment of the present invention.

As shown in FIG. 2, unlike the holographic recording and reproducing apparatus 100 shown in FIG. 1, in the holographic recording and reproducing apparatus 200 according to this embodiment, a CCD image sensor having a larger size and lower resolution that those of the spatial light modulator 104 is employed.

Therefore, the focal length f' of the reverse Fourier transform lens 106 is determined to be longer than the focal length f of the Fourier transform lens 105. Further, the focal length f' of the reverse Fourier transform lens 106 and the equally set distance between the reverse Fourier transform lens 106 and the CCD image sensor 107 are determined to be longer than the focal length f of the Fourier transform lens 105 and the equally set distance between the Fourier transform lens 105 and the spatial light modulator 104.

As a result, although the beam diameter of the signal beam which has not yet passed through the Fourier transform lens 105 is relatively small, the beam diameter of the signal beam passing through the Fourier transform lens 105 and the reverse Fourier transform lens 106 becomes larger than that of the signal beam which has not yet passed through the Fourier transform lens 105.

When data are to be reproduced, only the reference beam is projected onto the holographic recording medium 111 and the reference beam is diffracted by the interference pattern in the direction of optical axis of the signal beam, thereby generating a reproduced beam. At this time, a reproduced beam is emitted that has a large beam diameter like the signal beam passing through the holographic recording medium 111.

Therefore, a spatial light modulator 104 having a small size and high resolution can be employed irrespective of the resolution of the CCD image sensor 107.

Further, in this embodiment, the focal length f of the Fourier transform lens 105 and the equally set distance between the Fourier transform lens 105 and the spatial light modulator 104 are determined to be shorter than the focal length f' of the reverse Fourier transform lens 106 and the equally set distance between the reverse Fourier transform lens 106 and the CCD image sensor 107. Since this shortens the optical length between the spatial light modulator 104 and the point on which the signal beam is focused, the holographic recording and reproducing apparatus 200 can be made small.

Figure 3:
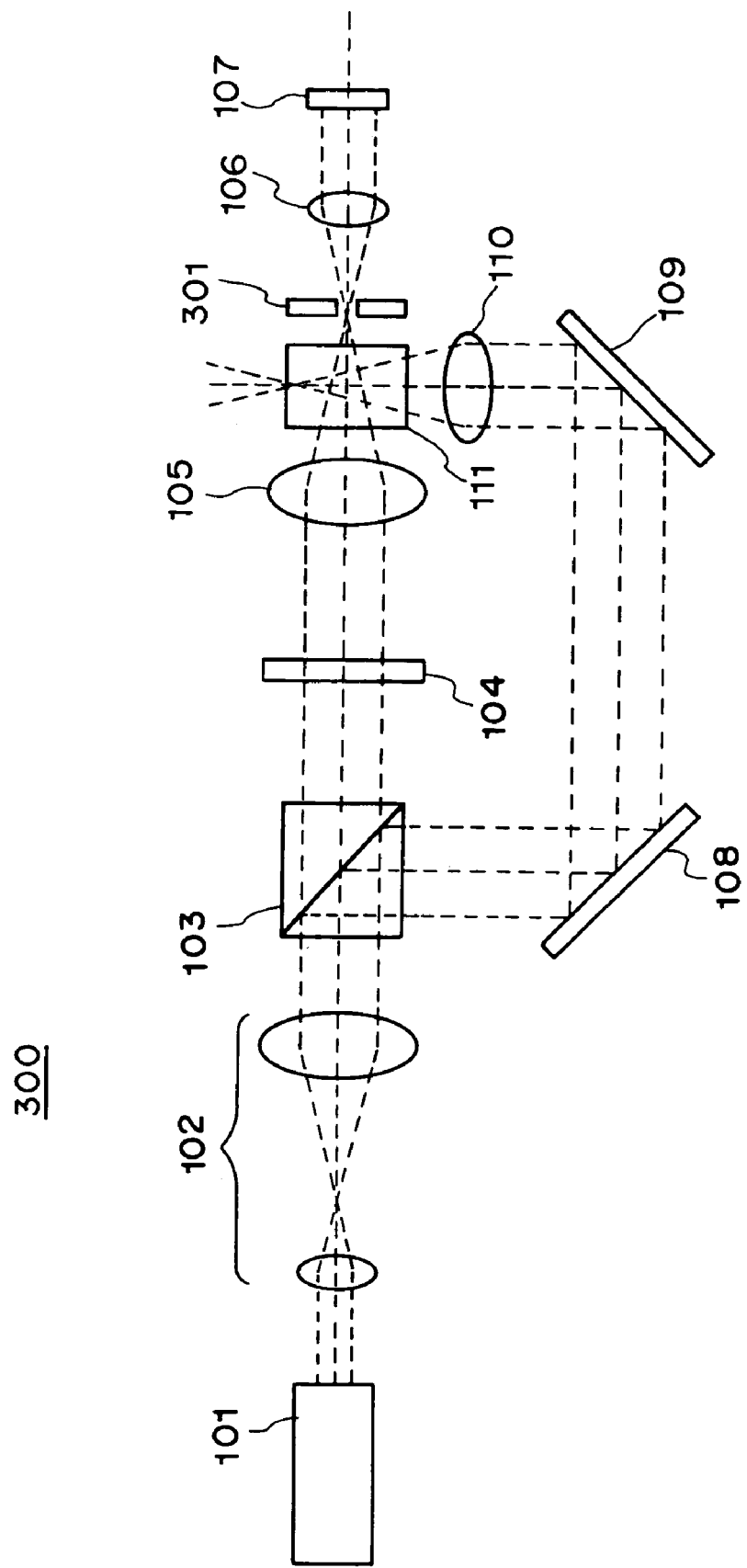
FIG. 3 is a block diagram of a holographic recording and reproducing apparatus that is a further preferred embodiment of the present invention.

FIG. 3 is a block diagram of a holographic recording and reproducing apparatus that is a further preferred embodiment of the present invention.

As shown in FIG. 3, a holographic recording and reproducing apparatus 300 further includes a pinhole 301.

In this embodiment, the imaging point of the Fourier transform lens 105 is located behind the holographic recording medium 111 and the pinhole 301 is provided at the confocal point of the Fourier transform lens 105 and the reverse Fourier transform lens 106, namely, behind the holographic recording medium 111.

The function of a spatial filter can be added to the holographic recording and reproducing apparatus 300 by providing the pinhole 301 at the confocal point of the Fourier transform lens 105 and the reverse Fourier transform lens 106, and it is therefore possible to remove a noise component of a reproduced beam when data are reproduced.

Figure 4:
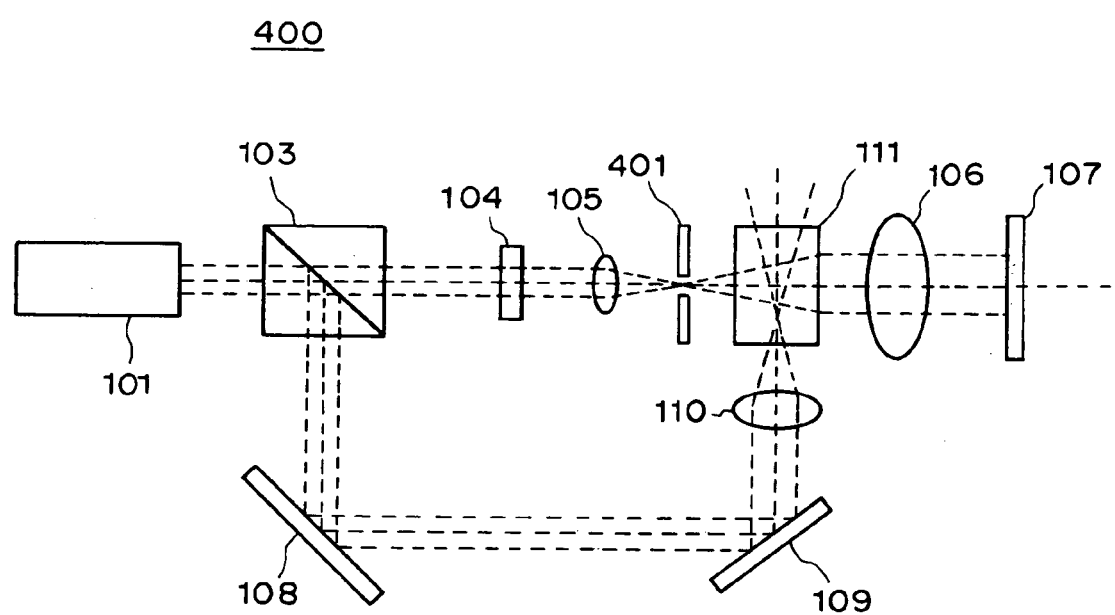
FIG. 4 is a block diagram of a holographic recording and reproducing apparatus that is a further preferred embodiment of the present invention.

FIG. 4 is a block diagram of a holographic recording and reproducing apparatus that is a further preferred embodiment of the present invention.

As shown in FIG. 4, a holographic recording and reproducing apparatus 400 according to this embodiment also includes a pinhole 401. However, in this embodiment, the imaging point of the Fourier transform lens 105 is located in front of the holographic recording medium 111. Therefore, the pinhole 401 is provided at the confocal point of the Fourier transform lens 105 and the reverse Fourier transform lens 106 in front of the holographic recording medium 111.

The function of a spatial filter can be added to the holographic recording and reproducing apparatus 400 by providing the pinhole 401 at the confocal point of the Fourier transform lens 105 and the reverse Fourier transform lens 106, and it is therefore possible to remove a noise component of a signal beam when data are recorded.

The present invention has thus been shown and described with reference to specific embodiments. However, it should be noted that the present invention is in no way limited to the details of the described arrangements but changes and modifications may be made without departing from the scope of the appended claims.

For example, although the pinhole 301 is provided at the confocal point of the Fourier transform lens 105 and the reverse Fourier transform lens 106 in the embodiment shown in FIG. 3 and the pinhole 401 is provided at the confocal point of the Fourier transform lens 105 and the reverse Fourier transform lens 106 in the embodiment shown in FIG. 4, a pinhole may be provided at the confocal point of the beam expander 102.

Further, in the above described embodiments, although the holographic recording and reproducing apparatus 100, 200, 300, 400 includes the spatial light modulator 104, the Fourier transform lens 105, the reverse Fourier transform lens 106 and the CCD image sensor 107 disposed in this order on the optical path of a signal beam and is constituted so that the holographic recording medium 111 is disposed between the Fourier transform lens 105 and the reverse Fourier transform lens 106, it is sufficient to provide at least the Fourier transform lens 105 and the reverse Fourier transform lens 106 on the optical path of a signal beam and for the Fourier transform lens 105 and the reverse Fourier transform lens 106 to have different focal lengths and it is not absolutely necessary for the holographic recording and reproducing apparatus to have the structure shown in one of FIGS. 1 to 4. For example, an optical element such as a mirror may be provided between the spatial light modulator 104 and the Fourier transform lens 105 and it is not absolutely necessary for the CCD image sensor 107 to be disposed immediately behind the reverse Fourier transform lens 106.

According to the present invention, it is possible to provide a holographic recording and reproducing apparatus which can be made compact even in the case where electronic devices such as a spatial light modulator, a CCD image sensor and the like having a large size and low resolution are used.

The invention claimed is:

1. A holographic recording and reproducing apparatus for recording data as phase information of light in a holographic recording medium by projecting a signal beam and a reference beam thereonto, the holographic recording and reproducing apparatus comprising at least a spatial light modulator, a Fourier transform lens, a reverse Fourier transform lens, a Charge Coupled Device (CCD) image sensor and a pinhole disposed at a confocal point of the Fourier transform lens and the reverse Fourier transform lens, the holographic recording medium being disposed between the Fourier transform lens and the reverse Fourier transform lens, and the focal length of the Fourier transform lens and focal length of the reverse Fourier transform lens being different from each other and remain unchanged, and the pinhole being disposed between the holographic recording medium and the Fourier transform lens or between the holographic recording medium and the reverse Fourier transform lens.

2. A holographic recording and reproducing apparatus in accordance with claim 1, wherein the focal length of the Fourier transform lens is set to be longer than that of the reverse Fourier transform lens.

3. A holographic recording and reproducing apparatus in accordance with claim 1, wherein the focal length of the reverse Fourier transform lens is set to be longer than that of the Fourier transform lens.

* * * * *